United States Patent
Lee

(10) Patent No.: US 7,298,019 B2
(45) Date of Patent: Nov. 20, 2007

(54) CAPACITOR OF SEMICONDUCTOR DEVICE AND METHOD OF MANUFACTURING THE SAME

(75) Inventor: Ki Min Lee, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,653

(22) Filed: Dec. 30, 2004

(65) Prior Publication Data

US 2006/0001063 A1    Jan. 5, 2006

(30) Foreign Application Priority Data

Jun. 30, 2004    (KR) .................... 10-2004-0050466

(51) Int. Cl.
*H01L 29/72* (2006.01)
(52) U.S. Cl. ............... 257/532; 257/534; 257/E27.048; 257/E27.071; 257/E27.092
(58) Field of Classification Search ................ 257/532, 257/534, E27.048, E27.071, E27.092
See application file for complete search history.

(56) References Cited

U.S. PATENT DOCUMENTS

| 2002/0160565 A1* | 10/2002 | Lee ............................. 438/240 |
| 2003/0178728 A1* | 9/2003 | Park et al. ................... 257/758 |
| 2003/0232497 A1* | 12/2003 | Xi et al. ...................... 438/627 |
| 2004/0013803 A1* | 1/2004 | Chung et al. .......... 427/255.391 |
| 2004/0108587 A1* | 6/2004 | Chudzik et al. ............. 257/700 |

\* cited by examiner

*Primary Examiner*—George Fourson
*Assistant Examiner*—Joannie Adelle Garcia
(74) *Attorney, Agent, or Firm*—Lowe Hauptman Ham & Berner LLP

(57) ABSTRACT

A MIM capacitor includes a lower electrode disposed on a semiconductor substrate. A dielectric layer is disposed on the lower electrode to completely cover an exposed surface of the lower electrode. An upper electrode is disposed on the dielectric layer. A method for forming a MIM capacitor includes forming a lower electrode on a semiconductor substrate. A dielectric layer and an upper metal layer are formed on an entire surface of the substrate to cover the lower electrode. The dielectric and upper metal layers are patterned on the lower electrode.

6 Claims, 3 Drawing Sheets

CAPACITOR OF SEMICONDUCTOR DEVICE AND METHOD OF MANUFACTURING THE SAME

BACKGROUND OF THE INVENTION (a) Field of the Invention

The present invention relates to a semiconductor, and more specifically to a metal-insulator-metal (MIM) capacitor and a method of manufacturing the MIM capacitor.

(b) Discussion of the Related Art

Generally, a capacitor used in memory cells includes a lower storage electrode, a dielectric layer and an upper plate electrode. Known techniques for increasing capacitance include: decreasing a thickness of the dielectric layer; increasing the effective surface through three dimensional capacitor structures; and using a dielectric layer having a high dielectric constant, such as $TaO_2$ or $Al_2O_3$. When $TaO_2$ is used in the dielectric layer, the capacitor has a MIS (Metal-Insulator-Semiconductor) or MIM (Metal-Insulator-Metal) structure with a metal upper electrode.

However, when the MIS structure capacitor uses $TaO_2$ or $Al_2O_3$ in the dielectric layer, a thickness of the dielectric layer increases. The increased thickness is caused by oxidation of polysilicon during a thermal treatment process performed at high temperature after the formation of the dielectric layer. Therefore, the capacitance of the MIS capacitor is reduced as the dielectric layer is made thicker. For these reasons, the MIM structure is often preferred over the MIS structure.

A method of manufacturing a related art MIM structure capacitor is explained with reference to FIG. 1.

As shown in FIG. 1, a lower metal layer is deposited on a semiconductor substrate 10 and photolithographically patterned to form a lower electrode 11. Then an insulating layer having a high dielectric constant and an upper metal layer are deposited, in this order, to cover the lower electrode 11. The upper metal layer and the insulating layer are patterned to form an upper electrode 13 and a dielectric 12 by a photolithography process, to expose portions of both sides of the lower electrode 11. This process results in the formation of the capacitor 100, having the MIM structure.

However, in the related art MIM structure, the lower electrode 11 is partially etched during the formation of the dielectric 12 and the upper electrode 13. Therefore, it is probable that re-deposition of the lower metal occurs on side surfaces of the dielectric 12 and the upper electrode 13, which may result in an electric shorts between the lower and upper electrodes 11 and 13.

Further, the lower electrode 11 is longer than the upper electrode 13, and thus the lower electrode 11 has exposed side surfaces. Therefore, at the side area parasitic capacitance can result, and the characteristics of the MIM capacitor may be degraded.

SUMMARY OF THE INVENTION

To address the above-described and other problems, the present invention advantageously provides a MIM capacitor includes a lower electrode disposed on a semiconductor substrate. A dielectric layer is disposed on the lower electrode to completely cover an exposed surface of the lower electrode. An upper electrode is disposed on the dielectric layer.

The present invention further provides a method for forming a MIM capacitor includes forming a lower electrode on a semiconductor substrate. A dielectric layer and an upper metal layer are formed on an entire surface of the substrate to cover the lower electrode. The dielectric and upper metal layers are patterned on the lower electrode.

It is to be understood that both the foregoing general description of the invention and the following detailed description are exemplary, but are not restrictive of the invention.

BRIEF DESCRIPTION OF THE DRAWINGS

The accompanying drawings, which are included to provide a further understanding of the invention and are incorporated in and constitute a part of this application, illustrate aspects of the invention and together with the description serve to explain the principle of the invention.

DETAILED DESCRIPTION OF THE INVENTION

Reference is made in detail to the embodiments of the present invention illustrated in the accompanying drawings. The same reference numbers are used throughout the drawings to refer to the same or similar parts.

Figure 1:
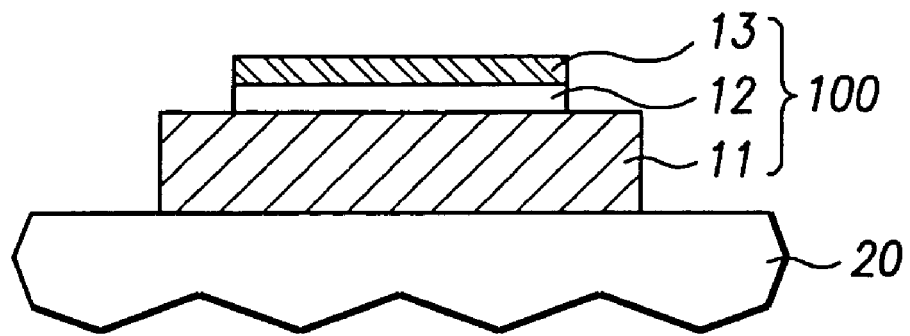
FIG. 1 is a sectional view of a related art MIM capacitor.
Figure 2A:
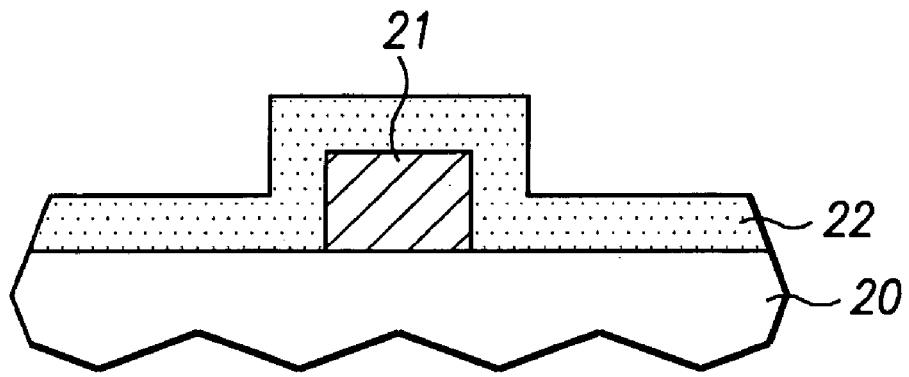
FIGS. 2A to 2E are sectional views showing a method of forming a MIM capacitor according to the present invention.

FIG. 2A shows a metal layer formed on a semiconductor substrate 20 and patterned by photolithography process to form a lower electrode 21. Preferably, the lower electrode 21 is formed from aluminum (Al), tungsten (W) or TiN metal. As a fluent film, a photoresist layer 22 is deposited on the substrate to cover the lower electrode 21.

Figure 2B:
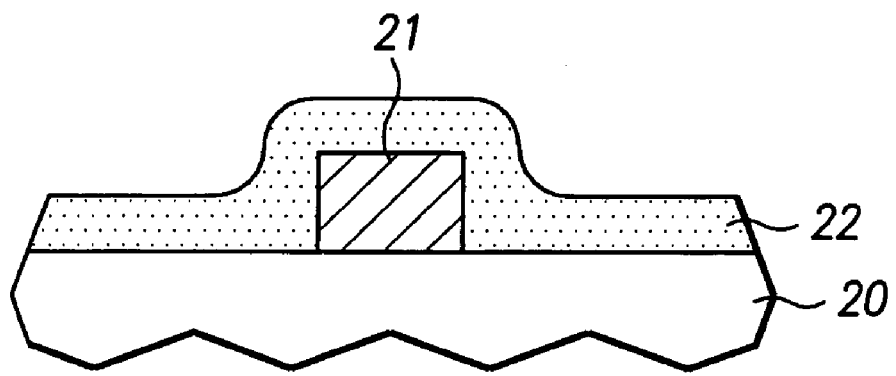

As shown in FIG. 2B, the photoresist layer 22 is reflowed to have curved profiles at portions covering the corners of the lower electrode 21. Preferably, the photoresist layer 22 is reflowed by thermal treating. The thermal treatment can be performed at a temperature from about 150° C. to about 300° C.

Figure 2C:
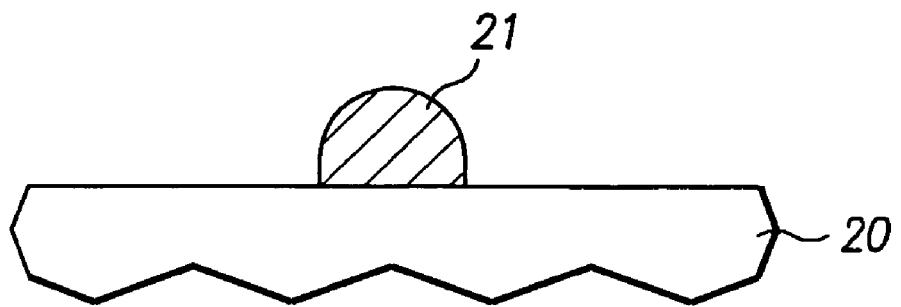

The reflowed photoresist layer 22 is removed by a process that simultaneously etches the photoresist layer 22 and the lower electrode 21. The etching ratio of the photoresist layer 22 and the lower electrode 21 is about 1:1, such that the etched lower electrode 21 has a curved profile (e.g., curved corners or an arcuate surface) as shown in FIG. 2C. Preferably, the etching process can be performed with a mixed gas of $Cl_2$, $BCl_3$, Ar and/or $CHF_3$, under a pressure of from about 8 mTorr to about 13 mTorr, a power source from about 900 W to about 1,200 W, and/or a bias power from about 140 W to about 200 W. The flow rate of the gases $Cl_2$, $BCl_3$, Ar and/or $CHF_3$ can be from about 60 sccm to about 90 sccm, from about 40 sccm to about 70 sccm, from about 30 sccm to about 50 sccm, and/or from about 2 sccm to about 5 sccm, respectively.

Figure 2D:
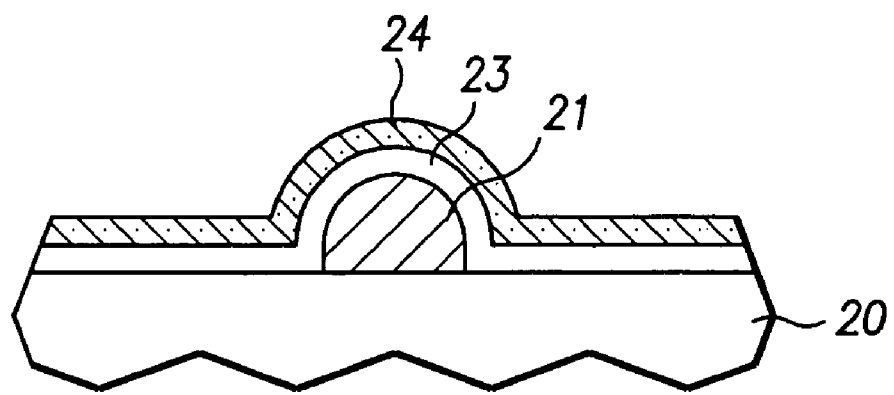

As the lower electrode 21 has curved corners, the deposition of an IMD (Inter Metal Dielectric) layer and an upper electrode is facilitated. Specifically, as shown in FIG. 2D, an insulating layer 23 having a high dielectric constant, and an upper metal layer 24, are deposited on the substrate to cover the lower electrode 21. Preferably, the insulating layer 23 is formed from $TaO_2$, $Al_2O_3$, and/or silicon nitride (SiN), and/or the upper metal layer 24 is formed from Ru, Pt, and/or TiN.

Figure 2E:
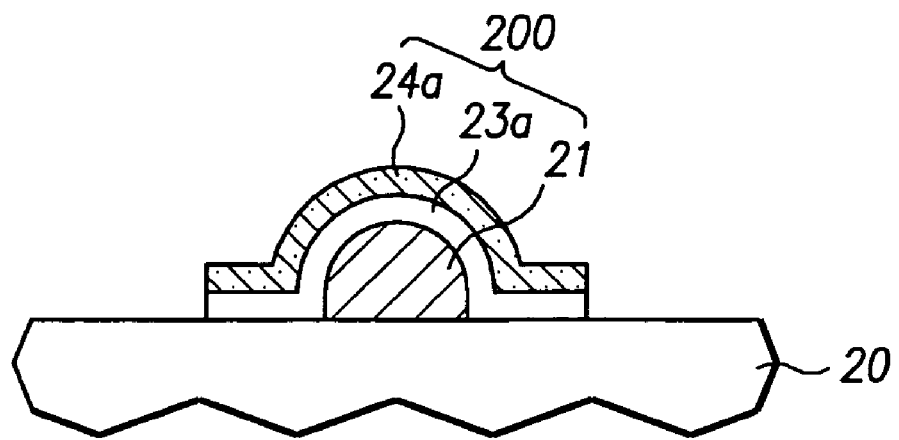

As shown in FIG. 2E, the insulating layer 23 and the upper metal layer 24 are patterned to form an IMD layer 23a and an upper electrode 24a. It is to be understood that in the MIM structure capacitor 200 of the present invention, the IMD layer 23a and the upper electrode 24a can completely cover the underlying lower electrode 21 without leaving any exposed surfaces of the lower electrode 21, as shown in the figure. Therefore, re-deposition of a lower electrode (such as the lower electrode 21) that may occur during a conventional etching process of a dielectric layer and an upper metal layer can be prevented. Further, electric shorting can be prevented between the lower and upper electrodes 21 and 24. Thus, the characteristics of the MIM structure capacitor 200 are improved as compared to a conventional MIM capacitor.

While the invention has been shown and described with reference to certain preferred embodiments thereof, it will be understood by those skilled in the art that various changes in form and details may be made therein without departing from the spirit and scope of the invention as defined by the appended claims.

The present application incorporates by reference in its entirety Korean Patent Application No. P2004-50466, filed in the Korean Patent Office on Jun. 30, 2004.

What is claimed is:

1. A MIM capacitor comprising:
    a lower electrode disposed on a semiconductor substrate;
    a dielectric layer disposed on the lower electrode to completely cover an exposed surface of the lower electrode; and
    an upper electrode disposed on the dielectric layer,
    wherein each of the dielectric layer and an upper layer has a curved profile following a topology of the lower electrode, and the lower electrode has a convex half-cylindrical profile and is located between the semiconductor substrate and the dielectric layer.

2. The capacitor according to claim 1, wherein the dielectric layer comprises at least one of TaO.sub.2, Al.sub.2O3 and SiN.

3. The capacitor according to claim 1, wherein at least one of the lower and upper electrodes comprises a metal.

4. The capacitor according to claim 3, wherein the lower and upper electrodes each comprise a metal.

5. The capacitor according to claim 1, wherein the lower electrode comprises is non-hollow.

6. The capacitor according to claim 1, wherein the lower electrode has an outer surface with the convex half cylindrical profile.

* * * * *